(12) United States Patent
Toratani et al.

(10) Patent No.: US 9,566,620 B2
(45) Date of Patent: Feb. 14, 2017

(54) SEMICONDUCTOR MANUFACTURING APPARATUS AND METHOD FOR CLEANING SAME

(71) Applicant: Kabushiki Kaisha Toshiba, Minato-ku, Tokyo (JP)

(72) Inventors: Kenichiro Toratani, Kanagawa-ken (JP); Fumiki Aiso, Kanagawa-ken (JP); Takashi Nakao, Kanagawa-ken (JP); Kazuhei Yoshinaga, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 837 days.

(21) Appl. No.: 13/960,044

(22) Filed: Aug. 6, 2013

(65) Prior Publication Data

US 2013/0319473 A1   Dec. 5, 2013

Related U.S. Application Data

(62) Division of application No. 12/557,264, filed on Sep. 10, 2009, now abandoned.

(30) Foreign Application Priority Data

Sep. 29, 2008   (JP) .................................. 2008-250259

(51) Int. Cl.
*B08B 5/00*   (2006.01)
*C23C 16/44*   (2006.01)
(Continued)

(52) U.S. Cl.
CPC ............. *B08B 5/00* (2013.01); *C23C 16/4405* (2013.01); *C23C 16/45514* (2013.01); *H01L 21/67017* (2013.01); *H01L 21/67109* (2013.01)

(58) Field of Classification Search
None
See application file for complete search history.

(56) References Cited

U.S. PATENT DOCUMENTS

| | | | |
|---|---|---|---|
| 4,108,106 A | | 8/1978 | Dozier |
| 5,110,408 A | * | 5/1992 | Fujii .................. H01L 21/3065 |
| | | | 204/192.37 |

(Continued)

FOREIGN PATENT DOCUMENTS

| | | |
|---|---|---|
| JP | 2003-297815 | 10/2003 |
| JP | 2007-317696 | 12/2007 |

(Continued)

OTHER PUBLICATIONS

Notification of Reason(s) for Refusal issued by the Japanese Patent Office on Sep. 18, 2013, for Japanese Patent Application No. 2011-131278, and English-language translation thereof.

(Continued)

*Primary Examiner* — Allan Olsen
(74) *Attorney, Agent, or Firm* — Finnegan, Henderson, Farabow, Garrett & Dunner LLP

(57) ABSTRACT

An LPCVD apparatus is provided with a processing chamber and a reaction cooling apparatus. The reaction cooling apparatus is placed outside the processing chamber and is configured to generate hydrogen fluoride gas by reaction of hydrogen gas and fluorine gas and to cool the hydrogen fluoride gas. The hydrogen fluoride gas cooled by the reaction cooling apparatus is supplied into the processing chamber as a cleaning gas.

7 Claims, 13 Drawing Sheets

(51) Int. Cl.
*C23C 16/455* (2006.01)
*H01L 21/67* (2006.01)

(56) References Cited

U.S. PATENT DOCUMENTS

| | | | | |
|---|---|---|---|---|
| 5,326,723 | A * | 7/1994 | Petro | B08B 7/0035 134/1.2 |
| 5,356,478 | A * | 10/1994 | Chen | B08B 7/0035 134/1 |
| 5,817,578 | A * | 10/1998 | Ogawa | B08B 7/0035 134/1.1 |
| 6,783,627 | B1 | 8/2004 | Mahawaili | |
| 6,925,731 | B2 | 8/2005 | Nishimura et al. | |
| 6,926,014 | B2 * | 8/2005 | Cheng | B08B 7/0035 134/1.1 |
| 7,121,286 | B2 | 10/2006 | Nakao | |
| 7,887,637 | B2 * | 2/2011 | Ozaki | B08B 7/0035 134/1.1 |
| 2004/0168638 | A1 | 9/2004 | Ishii et al. | |
| 2005/0202167 | A1 * | 9/2005 | Wu | C23C 14/083 427/226 |
| 2005/0284575 | A1 | 12/2005 | Hasebe et al. | |
| 2007/0163617 | A1 | 7/2007 | Ozaki et al. | |
| 2008/0076264 | A1 | 3/2008 | Okabe et al. | |
| 2008/0087817 | A1 | 4/2008 | Lopez-Avila et al. | |
| 2008/0105194 | A1 | 5/2008 | Nakao et al. | |
| 2010/0204494 | A1 * | 8/2010 | Hatano | B01J 23/44 549/523 |
| 2011/0162674 | A1 * | 7/2011 | Tang | H01J 37/32091 134/1.1 |
| 2013/0087174 | A1 * | 4/2013 | Sun | B08B 5/00 134/30 |
| 2014/0069459 | A1 * | 3/2014 | Guan | H05H 1/24 134/1.1 |

FOREIGN PATENT DOCUMENTS

| | | |
|---|---|---|
| JP | 2008-78457 | 4/2008 |
| JP | 2008-098431 | 4/2008 |

OTHER PUBLICATIONS

Notification of Reason(s) for Refusal issued by the Japanese Patent Office on Jun. 25, 2013, for Japanese Patent Application No. 2011-131278, and English-language translation thereof.

Decision of Refusal issued by the Japanese Patent Office on Mar. 11, 2011, for Japanese Patent Application No. 2008-250259, and English-language translation thereof.

Notification of Reason(s) for Refusal issued by the Japanese Patent Office on Dec. 22, 2010, for Japanese Patent Application No. 2008-250259, and English-language translation thereof.

* cited by examiner

SEMICONDUCTOR MANUFACTURING APPARATUS AND METHOD FOR CLEANING SAME

CROSS-REFERENCE TO RELATED APPLICATIONS

The is divisional of Application No. 12/557,264, Sep. 10, 2009, which is incorporated herein by references.

This application is based upon and claims the benefit of priority from the prior Japanese Patent Application No. 2008-250259, filed on Sep. 29, 2008; the entire contents of which are incorporated herein by reference.

BACKGROUND OF THE INVENTION

Field of the Invention

This invention relates to a semiconductor manufacturing apparatus and a method for cleaning the same using a cleaning gas generated by the reaction of a combustible gas and a combustion-supporting gas.

Background Art

In an LPCVD (low pressure chemical vapor deposition) apparatus, in the course of its use, a deposition film of thin film materials is inevitably formed inside its processing chamber.

The thin film materials include, for instance, silicon, silicon oxide, or silicon nitride to be deposited on a silicon wafer. Such a deposition film, when thickened, is delaminated into particles, which unfortunately contaminate the inside of the processing chamber and the wafer.

Thus, the inside of the processing chamber needs to be regularly cleaned to remove the deposition film. As a method for this cleaning, a technique of etching the deposition film by a cleaning gas containing hydrogen fluoride gas (HF) is developed. However, while the supply pipe of the cleaning gas is typically formed from stainless steel, hydrogen fluoride gas (HF) has very high corrosivity. Hence, if hydrogen fluoride gas itself is introduced into the processing chamber, it corrodes the supply pipe. Then, metal fluorides generated by corrosion flow into the processing chamber and contaminate the inside of the processing chamber and the wafer. Thus, an alternative cleaning technique is proposed in, e.g., JP-A-2008-098431(Kokai). In this technique, fluorine gas ($F_2$) and hydrogen gas ($H_2$) are separately introduced into the processing chamber and reacted therein to generate hydrogen fluoride gas (HF), which is used to clean the processing chamber.

However, the inventors have discovered that the inside of the processing chamber is locally damaged when it is cleaned by the method described in JP-A-2008-098431 (Kokai).

SUMMARY OF THE INVENTION

According to an aspect of the invention, there is provided a semiconductor manufacturing apparatus including: a processing chamber; and a reaction cooling apparatus placed outside the processing chamber and configured to generate a cleaning gas by reaction of a combustible gas and a combustion-supporting gas and to cool the cleaning gas, the cleaning gas which is cooled being supplied into the processing chamber.

According to another aspect of the invention, there is provided a semiconductor manufacturing apparatus including: a processing chamber; a combustible gas supply pipe configured to supply a combustible gas into the processing chamber; a combustion-supporting gas supply pipe configured to supply a combustion-supporting gas into the processing chamber; and at least one of another combustible gas supply pipe and another combustion-supporting gas supply pipe, one of the combustible gas supply pipe and the another combustible gas supply pipe for passing the combustible gas is temporally changed among them or one of the combustion-supporting gas supply pipe and the another combustion-supporting gas supply pipe for passing the combustion-supporting gas is temporally changed among them.

According to still another aspect of the invention, there is provided a method for cleaning a semiconductor manufacturing apparatus, including: a first supplying a combustible gas and a combustion-supporting gas into a processing chamber; and a second supplying the combustion-supporting gas into the processing chamber, the first supplying and the second supplying being alternately performed.

According to still another aspect of the invention, there is provided a method for cleaning a semiconductor manufacturing apparatus, including: supplying a combustible gas and a dilution gas into a processing chamber through a combustible gas supply pipe, and simultaneously supplying a combustion-supporting gas and a dilution gas into the processing chamber through a combustion-supporting gas supply pipe, at least one of a first supply amount of the dilution gas supplied through the combustible gas supply pipe and a second supply amount of the dilution gas supplied through the combustion-supporting gas supply pipe being temporally changed.

According to still another aspect of the invention, there is provided a method for cleaning a semiconductor manufacturing apparatus including a processing chamber, a combustible gas supply pipe configured to supply a combustible gas into the processing chamber, and a combustion-supporting gas supply pipe configured to supply a combustion-supporting gas into the processing chamber, at least one of the combustible gas supply pipe and the combustion-supporting gas supply pipe being provided in a plurality, the method including: temporally changing the supply pipe for passing the combustible gas or the combustion-supporting gas among the plurality of combustible gas supply pipes or the plurality of combustion-supporting gas supply pipes.

DETAILED DESCRIPTION OF THE INVENTION

Embodiments of the invention will now be described with reference to the drawings.

At the outset, a first embodiment of the invention is described.

Figure 1:
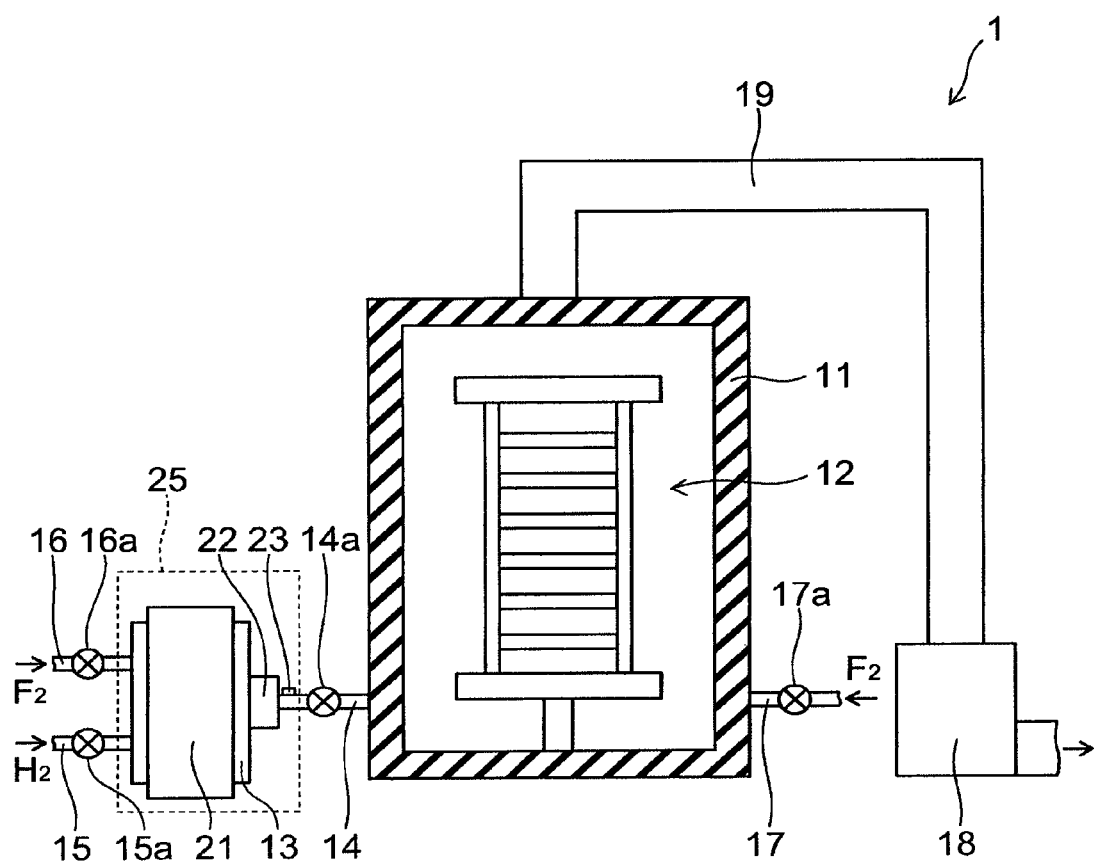
FIG. 1 is a schematic view illustrating a semiconductor manufacturing apparatus according to a first embodiment of the invention.

FIG. 1 is a schematic view illustrating a semiconductor manufacturing apparatus according to this embodiment.

Figure 2:
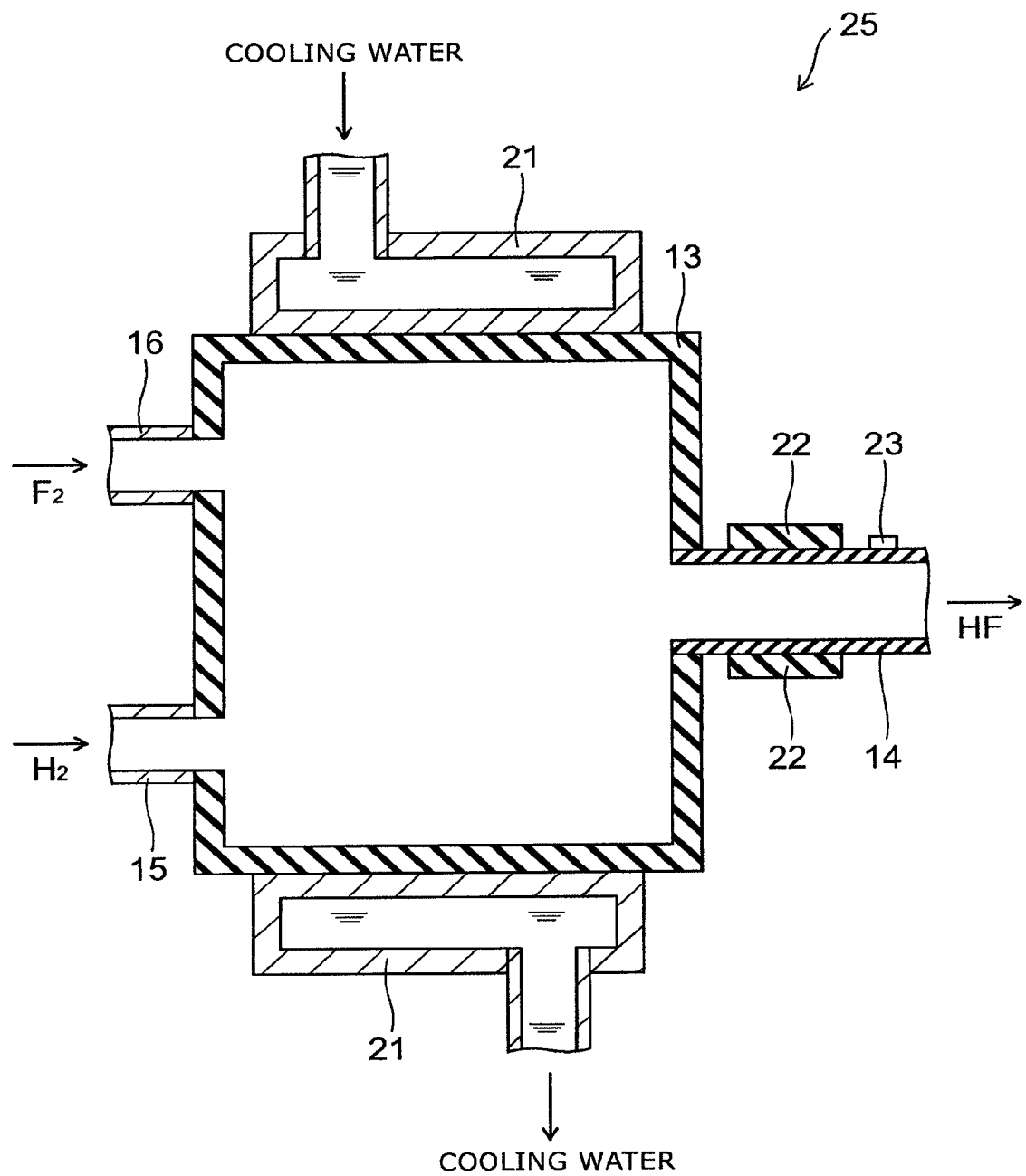
FIG. 2 is a cross-sectional view illustrating the reaction cooling apparatus shown in FIG. 1.

FIG. 2 is a cross-sectional view illustrating the reaction cooling apparatus shown in FIG. 1.

The semiconductor manufacturing apparatus according to this embodiment is an apparatus for manufacturing a semiconductor device, such as an LSI (large-scale integrated circuit) chip, and more specifically an LPCVD apparatus.

As shown in FIG. 1, the LPCVD apparatus 1 according to this embodiment includes a processing chamber 11 for forming a thin film on a workpiece, such as a silicon wafer, by the LPCVD method. In the processing chamber 11 is provided a wafer boat 12 or other jig for holding workpieces (not shown), such as silicon wafers. The processing chamber 11 and the wafer boat 12 or other jig are formed from quartz.

In the LPCVD apparatus 1, in the course of its use, a deposition film is formed inside the processing chamber 11, that is, on the surface of the inner wall of the processing chamber 11 and the wafer boat 12 or other jig. Thus, in this embodiment, hydrogen fluoride gas (HF) is used as a cleaning gas to remove this deposition film. Hydrogen fluoride gas (HF) is generated by the combustion reaction of hydrogen gas ($H_2$) and fluorine gas ($F_2$). In this specification, the combustion reaction refers to an exothermic chemical reaction, caused by coupling between at least one combustible gas and at least one combustion-supporting gas. The combustion-supporting gas is not limited to oxygen. For instance, it is fluorine in this embodiment.

A reaction chamber 13 is provided outside the processing chamber 11. The reaction chamber 13 is in connection with the processing chamber 11 by an HF supply pipe 14. The reaction chamber 13 and the HF supply pipe 14 are illustratively formed from alumina ($Al_2O_3$). The HF supply pipe 14 is provided with a valve 14a.

The reaction chamber 13 is in connection with a hydrogen gas supply pipe 15 and a fluorine gas supply pipe 16.

The hydrogen gas supply pipe 15 and the fluorine gas supply pipe 16 serve to supply hydrogen gas ($H_2$) and fluorine gas ($F_2$), respectively, into the reaction chamber 13, and are illustratively formed from stainless steel. The hydrogen gas supply pipe 15 and the fluorine gas supply pipe 16 are provided with valves 15a and 16a, respectively.

The processing chamber 11 is also in connection with another fluorine gas supply pipe 17. The fluorine gas supply pipe 17 serves to directly supply fluorine gas ($F_2$) into the processing chamber 11 without the intermediary of the reaction chamber 13, and is illustratively formed from stainless steel. The fluorine gas supply pipe 17 is provided with a valve 17a. Furthermore, a vacuum pump 18 is provided outside the processing chamber 11. The processing chamber 11 is in connection with the vacuum pump 18 by an exhaust pipe 19.

As shown in FIGS. 1 and 2, a water-cooling apparatus 21 as a cooling mechanism is provided around the reaction chamber 13. The water-cooling apparatus 21 is a hollow structure illustratively made of a metal, and its outer wall is in contact with the outer wall of the reaction chamber 13. The water-cooling apparatus 21 cools the reaction chamber 13 by allowing cooling water to flow through this hollow structure.

A jacket heater 22 as a heating mechanism is wound around the outer surface of the HF supply pipe 14. The jacket heater 22 is an electric heater in which an electric heating wire is provided in a sheet-like heat insulator. The jacket heater 22 produces heat upon energization and heats the HF supply pipe 14. Furthermore, a temperature sensor 23, such as a thermocouple, is attached to the outer surface of the HF supply pipe 14. The reaction chamber 13, the HF supply pipe 14, the water-cooling apparatus 21, the jacket heater 22, and the temperature sensor 23 constitute a reaction cooling apparatus 25.

Next, a description is given of the operation of the semiconductor manufacturing apparatus according to this embodiment configured as described above, that is, a method for cleaning a semiconductor manufacturing apparatus according to this embodiment.

The valves 14a, 15a, and 16a are opened. While the vacuum pump 18 is activated to evacuate the processing chamber 11, hydrogen gas ($H_2$) is supplied to the hydrogen gas supply pipe 15 at a flow rate of e.g. 1 slm (standard liter/min), and fluorine gas ($F_2$) is supplied to the fluorine gas supply pipe 16 at a flow rate of e.g. 1 slm. On the other hand, fluorine gas ($F_2$) is supplied into the processing chamber 11 through the fluorine gas supply pipe 17. Furthermore, the water-cooling apparatus 21 is activated to pass cooling water through the water-cooling apparatus 21. Moreover, the temperature sensor 23 is activated.

Thus, hydrogen gas and fluorine gas are supplied into the reaction chamber 13. Hydrogen gas is a combustible gas, and fluorine gas is a combustion-supporting gas. Hence, these gases react to generate hydrogen fluoride gas (HF), which serves as a cleaning gas. At this time, heat of reaction is produced by the reaction of hydrogen gas and fluorine gas. This heat of reaction is transferred through the reaction chamber 13 to the water-cooling apparatus 21 and exhausted by the cooling water flowing in the water-cooling apparatus 21. That is, the water-cooling apparatus 21 cools the cleaning gas through the reaction chamber 13.

Then, the cooled cleaning gas is introduced through the HF supply pipe 14 into the processing chamber 11. The hydrogen fluoride gas (HF) introduced from the HF supply pipe 14 into the processing chamber 11 is mixed with the fluorine gas ($F_2$) introduced through the fluorine gas supply pipe 17 into the processing chamber 11. This mixed gas etches the surface of the inner wall of the processing chamber 11 and the wafer boat 12 or other jig and removes the deposition film. Thus, the inside of the processing chamber 11 is cleaned.

Here, hydrogen gas and fluorine gas react in the reaction chamber 13 placed outside the processing chamber 11 and are turned into hydrogen fluoride gas, which is sufficiently cooled by the water-cooling apparatus 21 and then introduced into the processing chamber 11. Hence, there is no case where hydrogen gas and fluorine gas react in the processing chamber 11 to locally reach a high temperature, causing damage to the processing chamber 11 and the wafer boat 12 or other jig.

Furthermore, the temperature of the cleaning gas flowing through the HF supply pipe 14 is measured by the temperature sensor 23. When the temperature of the cleaning gas is excessively decreased, the jacket heater 22 is activated to heat the cleaning gas. Thus, the temperature of the cleaning gas is kept at a constant temperature, such as 50° C. This allows etching under a constant condition.

Next, the effect of this embodiment is described.

As described above, according to this embodiment, hydrogen gas and fluorine gas are reacted in the reaction chamber 13 placed outside the processing chamber 11 to generate hydrogen fluoride gas, which is sufficiently cooled by the water-cooling apparatus 21 and then introduced into the processing chamber 11. Hence, there is no case where hydrogen gas and fluorine gas react in the processing chamber 11 to produce a high-temperature flame, the heat of which causes damage to the processing chamber 11, the wafer boat 12 and the like. That is, damage due to cleaning can be prevented.

Furthermore, the reaction chamber 13 and the HF supply pipe 14 are superior in heat resistance and thermal conductivity because they are formed from alumina. Thus, they are not damaged by hydrogen fluoride gas and the heat of reaction, and can efficiently cool the cleaning gas. Here, the material of the reaction chamber 13 and the HF supply pipe 14 is not limited to alumina, but can be any material superior in heat resistance and thermal conductivity.

Furthermore, the cooling mechanism for cooling the cleaning gas is implemented by the water-cooling apparatus 21. Thus, this embodiment can realize a cost-effective cooling mechanism with easy procurement and maintenance and high cooling efficiency.

Furthermore, hydrogen gas and fluorine gas are separately introduced into the reaction chamber 13. Hence, even if the hydrogen gas supply pipe 15 and the fluorine gas supply pipe 16 are formed from stainless steel, these supply pipes are not corroded by hydrogen fluoride gas. Thus, general-purpose stainless steel pipes can be used for the hydrogen gas supply pipe 15 and the fluorine gas supply pipe 16.

Furthermore, the jacket heater 22 is provided in this embodiment. Hence, the temperature of the cleaning gas is not excessively decreased, and the deposition film can be etched under a suitable condition. Furthermore, because the temperature sensor 23 is provided, the temperature of the cleaning gas can be accurately monitored.

Here, even without the jacket heater 22, the cleaning gas is heated by the reaction of hydrogen gas and fluorine gas, and cooled by the water-cooling apparatus 21. Hence, by adjusting the balance between these heating and cooling, the temperature of the cleaning gas can be kept constant.

Furthermore, even without the temperature sensor 23, the temperature of the cleaning gas can be monitored by, for instance, a temperature sensor (not shown) provided in the processing chamber 11. However, by providing the jacket heater 22 and the temperature sensor 23, the temperature of the cleaning gas can be controlled more easily and accurately.

Next, a comparative example of this embodiment is described.

Figure 3:
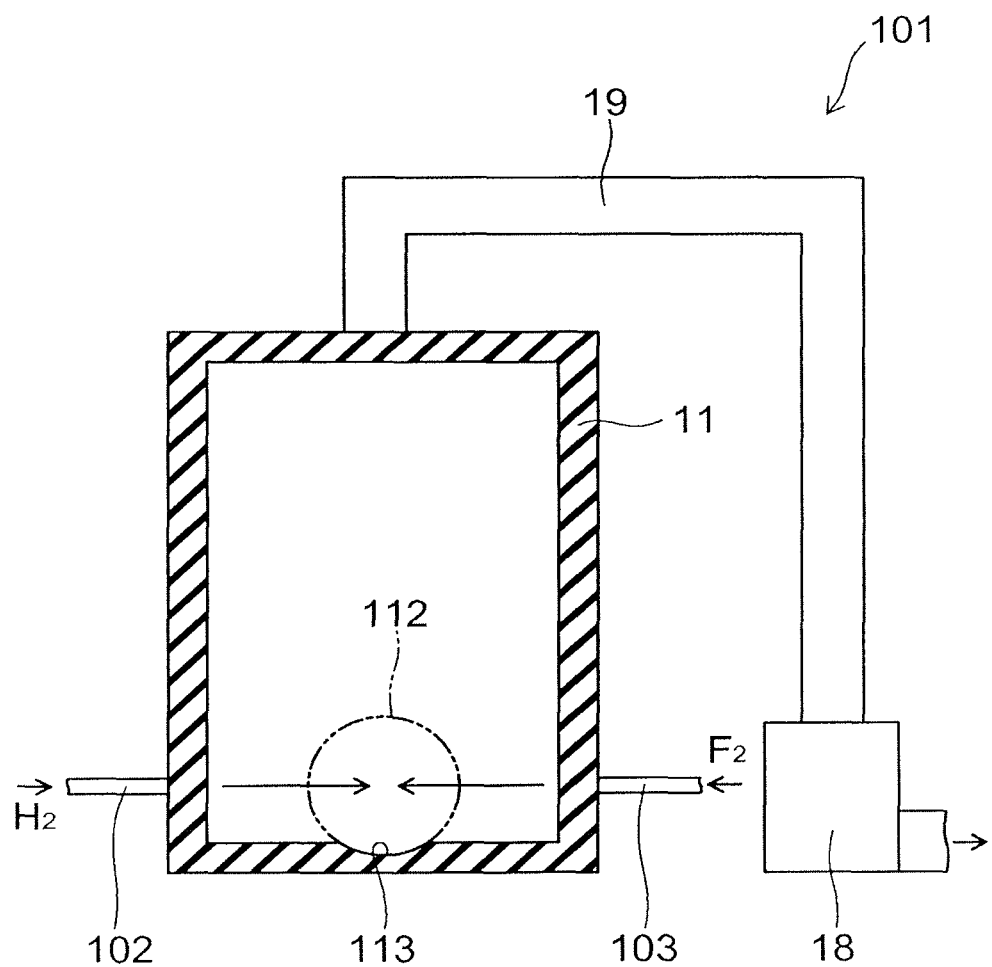
FIG. 3 is a schematic view illustrating a semiconductor manufacturing apparatus according to a comparative example of the first embodiment.

FIG. 3 is a schematic view illustrating a semiconductor manufacturing apparatus according to this comparative example.

As shown in FIG. 3, in contrast to the LPCVD apparatus 1 (see FIG. 1) according to the above first embodiment, the LPCVD apparatus 101 according to this comparative example does not include the reaction cooling apparatus 25, but hydrogen gas ($H_2$) and fluorine gas ($F_2$) are directly supplied into the processing chamber 11 through a hydrogen supply pipe 102 and a fluorine supply pipe 103, respectively. Thus, hydrogen gas and fluorine gas react inside the processing chamber 11 to generate hydrogen fluoride gas (HF). A mixed gas of this hydrogen fluoride gas (HF) and fluorine gas ($F_2$) is used to etch the deposition film. In FIG. 3, for clarity of illustration, the wafer boat 12 (see FIG. 1) is not shown.

In this comparative example, hydrogen gas and fluorine gas are mixed in the processing chamber 11. Hydrogen reacts violently with fluorine to produce heat of reaction, hence locally producing a high-temperature flame. This flame is produced always in the same region 112, because it is produced at the position where hydrogen gas and fluorine gas introduced into the processing chamber 11 meet with each other. Hence, in this region 112, the processing chamber 11 and the wafer boat or other jig made of quartz are damaged by the heat of reaction, causing local damage 113. This requires frequent replacement of components. Furthermore, dust occurs from the damaged portion. This results in decreasing the productivity of semiconductor devices.

In contrast, the above first embodiment can prevent damage to the processing chamber and the like due to cleaning, achieving low frequency of replacing components and little dust generation. Thus, semiconductor devices can be manufactured with high productivity.

Next, a second embodiment of the invention is described.

Figure 4:
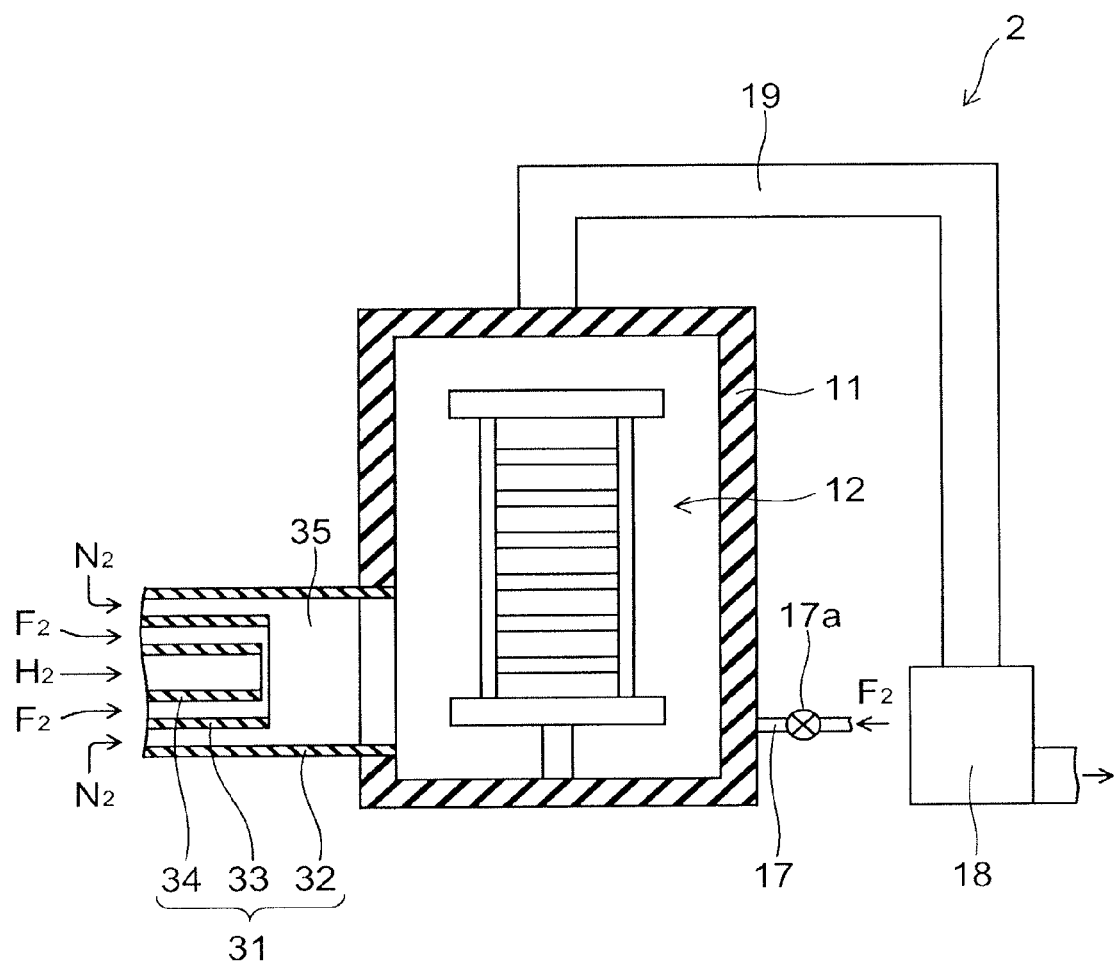
FIG. 4 is a schematic view illustrating a semiconductor manufacturing apparatus according to a second embodiment of the invention.

FIG. 4 is a schematic view illustrating a semiconductor manufacturing apparatus according to this embodiment.

Figure 5:
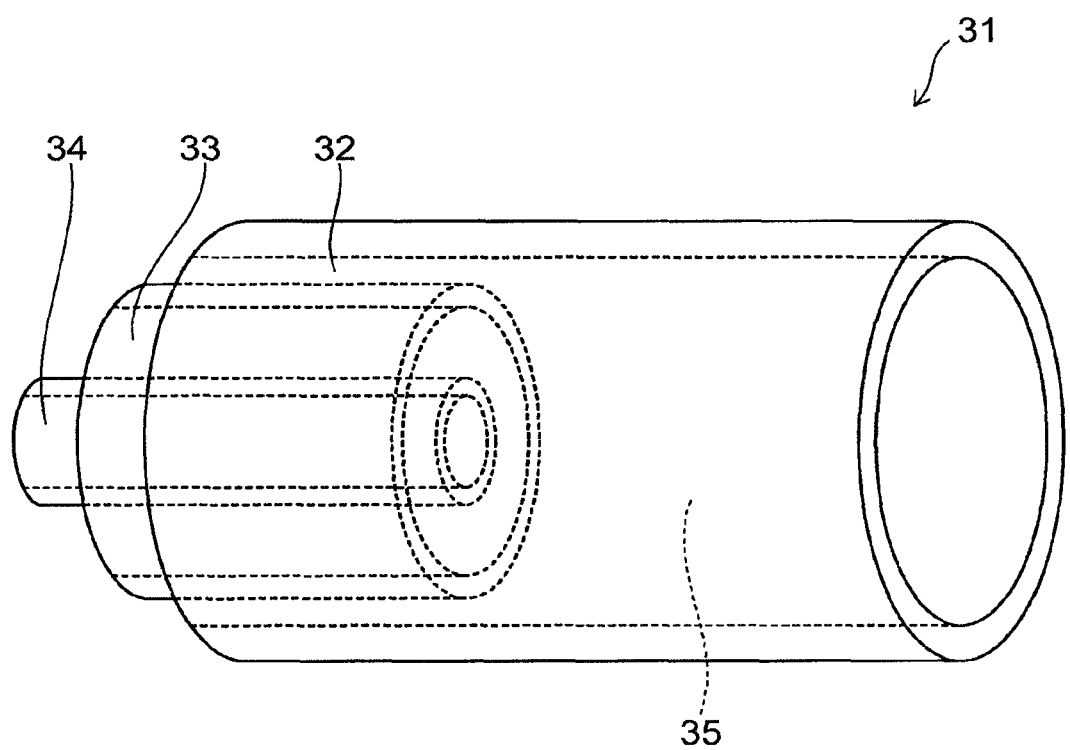
FIG. 5 is a perspective view illustrating the triple pipe shown in FIG. 4.

FIG. 5 is a perspective view illustrating the triple pipe shown in FIG. 4.

The semiconductor manufacturing apparatus according to this embodiment is also an LPCVD apparatus.

As shown in FIG. 4, in contrast to the LPCVD apparatus 1 (see FIGS. 1 and 2) according to the above first embodiment, the LPCVD apparatus 2 according to this embodiment includes a triple pipe 31 as a reaction cooling apparatus instead of the reaction cooling apparatus 25. The end portion of the triple pipe 31 is coupled to the processing chamber 11.

As shown in FIGS. 4 and 5, the triple pipe 31 includes an outer tube 32, a middle tube 33, and an inner tube 34 coaxially in this order from outside. That is, the middle tube 33 is placed inside the outer tube 32, and the inner tube 34 is placed inside the middle tube 33. The outer tube 32, the middle tube 33, and the inner tube 34 are illustratively formed from alumina.

The end portion of the outer tube 32 is coupled to the processing chamber 11, and the inside of the outer tube 32 is in connection with the inside of the processing chamber 11. The middle tube 33 is terminated at a position spaced from the processing chamber 11, and the terminated portion is opened to inside the outer tube 32. Furthermore, the inner tube 34 is also terminated at a position spaced from the processing chamber 11, and the terminated portion is opened to inside the outer tube 32. For instance, the middle tube 33 and the inner tube 34 are terminated at the same position. Thus, the middle tube 33 and the inner tube 34 are not placed inside the portion of the outer tube 32 on the processing chamber 11 side, and this portion constitutes a single continuous space 35.

Hydrogen gas ($H_2$) is supplied into the inner tube 34. Fluorine gas ($F_2$) is supplied between the inner tube 34 and the middle tube 33. Furthermore, a cooling gas is supplied between the middle tube 33 and the outer tube 32. The cooling gas is a gas which does not react with the combustible gas and the combustion-supporting gas. In this embodiment, the cooling gas is a gas which does not react with hydrogen gas ($H_2$) and fluorine gas ($F_2$), such as nitrogen gas ($N_2$). The temperature of the cooling gas is preferably room temperature or less. That is, the cooling gas can be at room temperature, or can be cooled to a temperature lower than room temperature, but preferably, it is not heated at least actively. The configuration of this embodiment other than the foregoing is the same as that of the above first embodiment.

Next, the operation and effect of this embodiment are described.

A combustible gas, a combustion-supporting gas, and a cooling gas are supplied to the triple pipe 31 from its portion not communicating with the processing chamber 11. Here, hydrogen gas ($H_2$), which is a combustible gas, is supplied into the inner tube 34, fluorine gas ($F_2$), which is a combustion-supporting gas, is supplied between the inner tube 34 and the middle tube 33, and nitrogen gas ($N_2$), which is a cooling gas, is supplied between the middle tube 33 and the outer tube 32. These gases flow separately in the portion of the triple pipe 31 where the middle tube 33 and the inner tube 34 are placed, but mixed with each other in the space 35. Thus, hydrogen gas and fluorine gas react to generate hydrogen fluoride gas (HF). At this time, heat of reaction is produced, but cooled by the nitrogen gas having a temperature of room temperature or less. After the reaction is substantially completed, the hydrogen fluoride gas is introduced into the processing chamber 11 in the sufficiently cooled state.

Also in this embodiment, like the above first embodiment, hydrogen gas and fluorine gas react outside the processing chamber 11 to generate hydrogen fluoride gas, which is cooled and then introduced into the processing chamber 11. Hence, damage to the processing chamber 11 and the like due to heat of reaction can be prevented. Furthermore, even if unreacted hydrogen gas and fluorine gas are introduced into the processing chamber 11, these gases have been diluted by nitrogen gas. Hence, the reaction can be suppressed, and damage to the processing chamber 11 and the like can be prevented. The operation and effect of this embodiment other than the foregoing are the same as those of the above first embodiment.

In this embodiment, the triple pipe 31 is supplied with hydrogen gas, fluorine gas, and nitrogen gas in this order from inside. However, the invention is not limited thereto, but they are supplied in the order of, for instance, fluorine gas, hydrogen gas, and nitrogen gas from inside. Furthermore, the cooling gas is not limited to nitrogen gas, but can be any gas which does not react with hydrogen gas and fluorine gas. Here, if the cooling gas is a gas with large specific heat, such as carbon dioxide ($CO_2$), then the cooling efficiency can be increased.

Furthermore, the material of the triple pipe 31 is not limited to alumina, but can be any material superior in heat resistance and thermal conductivity.

Next, a variation of this embodiment is described.

Figure 6:
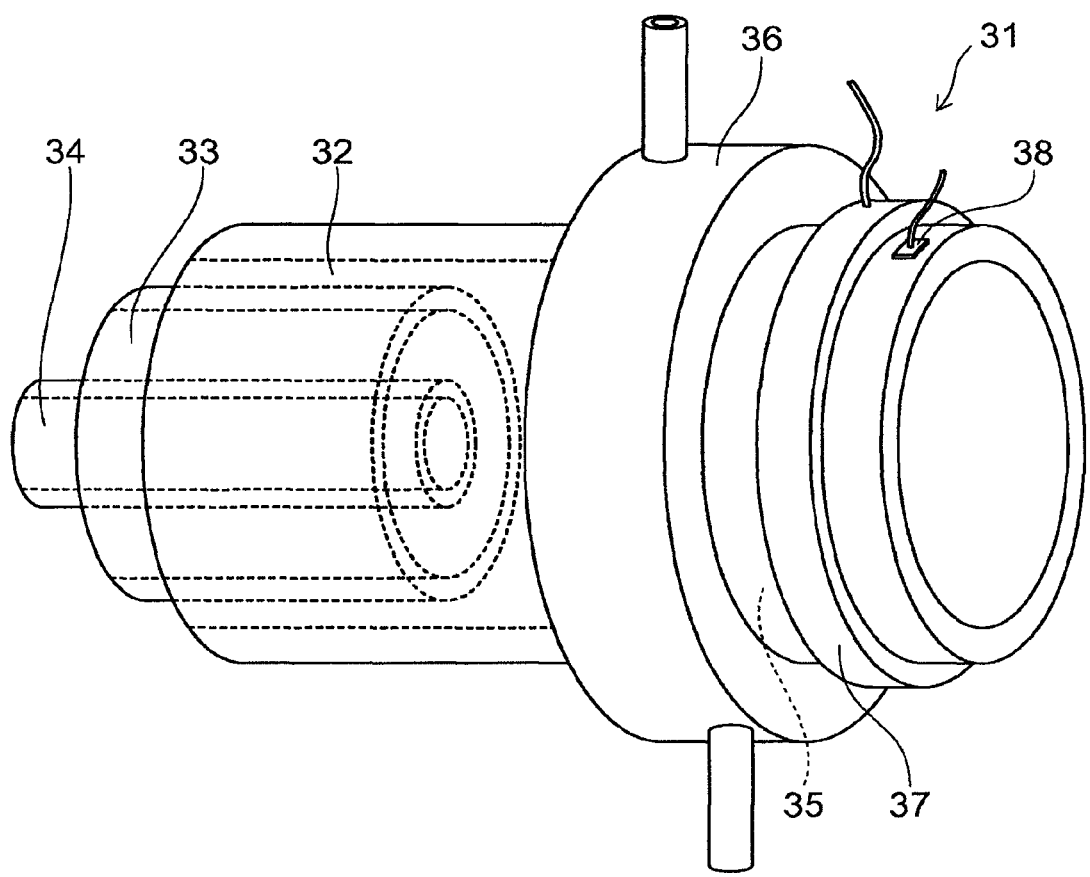
FIG. 6 is a perspective view illustrating a triple pipe in a variation of the second embodiment.

FIG. 6 is a perspective view illustrating a triple pipe in this variation.

As shown in FIG. 6, in this variation, a water-cooling apparatus 36, a jacket heater 37, and a temperature sensor 38 are attached to the outer surface of the triple pipe 31. The operation of the water-cooling apparatus 36, the jacket heater 37, and the temperature sensor 38 is as described in the above first embodiment. Thus, according to this variation, the temperature of the cleaning gas can be controlled more easily and accurately. The configuration, operation, and effect of this variation other than the foregoing are the same as those of the above second embodiment.

Next, a third embodiment of the invention is described.

Figure 7:
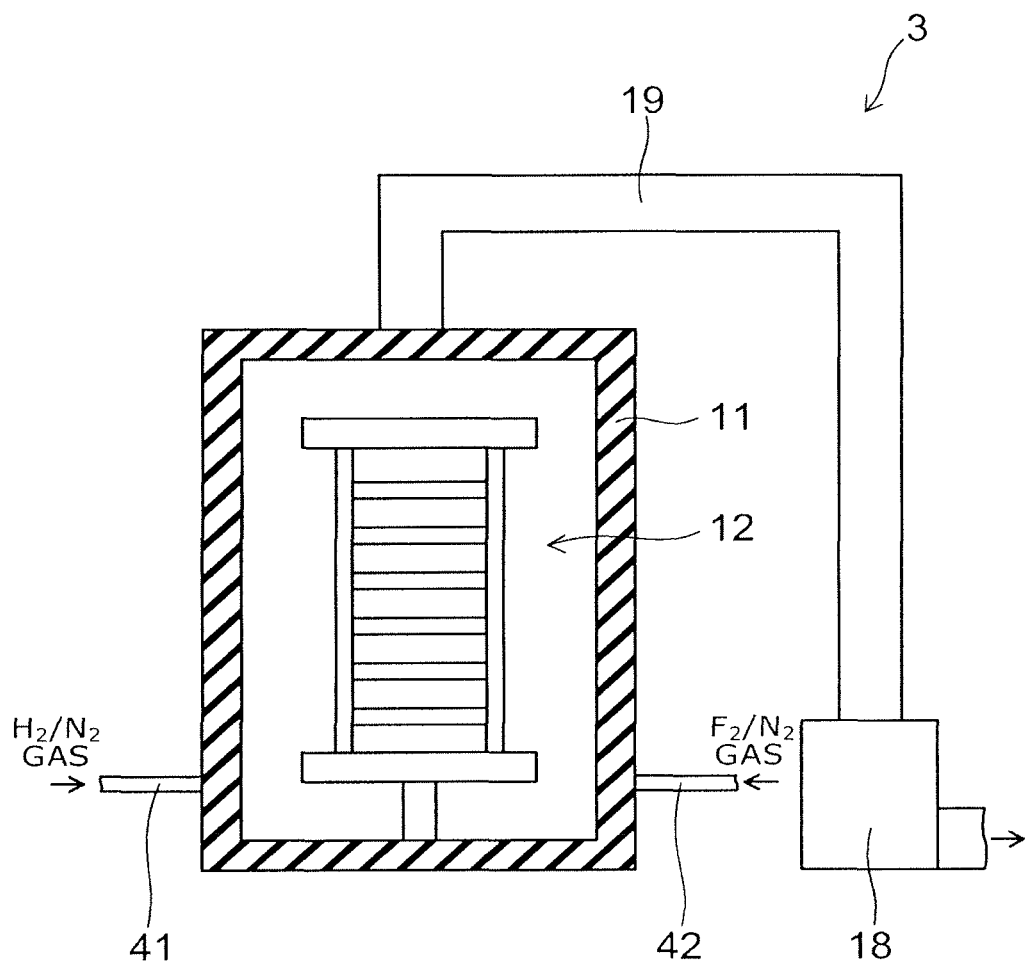
FIG. 7 is a schematic view illustrating a semiconductor manufacturing apparatus according to a third embodiment of the invention.

FIG. 7 is a schematic view illustrating a semiconductor manufacturing apparatus of this embodiment.

Figure 8:
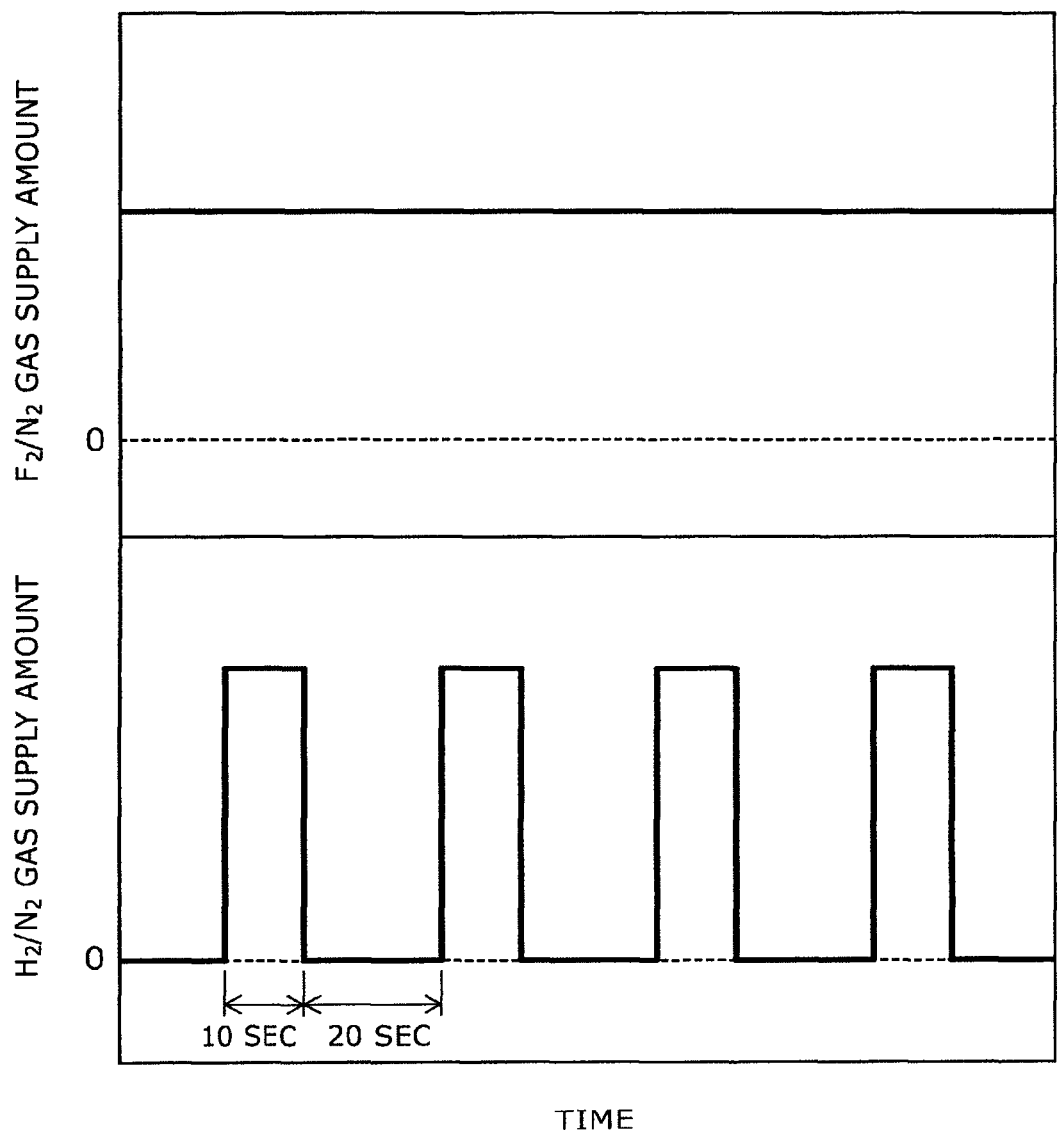
FIG. 8 is a graph illustrating change in the supply amount of each gas in the third embodiment, where the horizontal axis represents time, and the vertical axis represents gas supply amount.

FIG. 8 is a graph illustrating change in the supply amount of each gas in this embodiment, where the horizontal axis represents time, and the vertical axis represents gas supply amount.

In this specification, the "supply amount" refers to the amount of gas introduced into the processing chamber 11 per unit time.

As shown in FIG. 7, in contrast to the LPCVD apparatus 1 (see FIG. 1) according to the above first embodiment, the LPCVD apparatus 3 used in this embodiment does not include the reaction cooling apparatus 25. A hydrogen/nitrogen supply pipe 41 and a fluorine/nitrogen supply pipe 42 are in direct connection with the processing chamber 11. The configuration of the LPCVD apparatus 3 other than the foregoing is the same as that of LPCVD apparatus 1 according to the above first embodiment.

Next, a method for cleaning a semiconductor manufacturing apparatus according to this embodiment is described.

As shown in FIG. 7, according to this embodiment, in the LPCVD apparatus 3, a mixed gas (hereinafter referred to as "$H_2/N_2$ gas") of hydrogen gas ($H_2$) and nitrogen gas ($N_2$) is introduced into the processing chamber 11 through the hydrogen/nitrogen supply pipe 41, and a mixed gas (hereinafter referred to as "$F_2/N_2$ gas") of fluorine gas ($F_2$) and nitrogen gas ($N_2$) is introduced into the processing chamber 11 through the fluorine/nitrogen supply pipe 42. The temperature of each gas is illustratively room temperature. Each gas is mixed not immediately before being introduced into the processing chamber 11 but at a position remotely distanced from the processing chamber 11. For instance, hydrogen gas and fluorine gas are mixed with nitrogen gas at a position immediately following the outlets of cylinders storing hydrogen gas and fluorine gas.

As shown in FIG. 8, while the flow rate of the $F_2/N_2$ gas introduced into the processing chamber 11 through the fluorine/nitrogen supply pipe 42 is kept constant, the $H_2/N_2$ gas is intermittently supplied. Thus, the step of supplying both hydrogen gas, which is a combustible gas, and fluorine gas, which is a combustion-supporting gas, into the processing chamber 11, and the step of supplying only fluorine gas, which is a combustion-supporting gas, are alternately performed. For instance, while continuously supplying the $F_2/N_2$ gas, the cycle of supplying the $H_2/N_2$ gas for 10 seconds and stopping it for 20 seconds is repeated.

According to this embodiment, when the $F_2/N_2$ gas and the $H_2/N_2$ gas are both supplied into the processing chamber 11, the reaction of fluorine gas ($F_2$) and hydrogen gas ($H_2$) occurs in the processing chamber 11, generating hydrogen fluoride gas (HF) and producing heat of reaction. Thus, the deposition film adhered to the processing chamber 11, the wafer boat 12 and the like is etched by the generated hydrogen fluoride gas (HF) and fluorine gas ($F_2$), and simultaneously the processing chamber 11, the wafer boat 12 and the like are heated by the heat of reaction.

When the supply of the $H_2/N_2$ gas is stopped and only the $F_2/N_2$ gas is supplied into the processing chamber 11, the reaction of fluorine gas ($F_2$) and hydrogen gas ($H_2$) scarcely occurs, and etching proceeds by the already generated hydrogen fluoride gas and fluorine gas. At this time, because no heat of reaction is produced, the processing chamber 11, the wafer boat 12 and the like are cooled.

Thus, according to this embodiment, the processing chamber 11, the wafer boat 12 and the like are heated and cooled. Hence, their temperature does not significantly increase. In contrast, even if the total supply amount of hydrogen gas is the same, continuously supplying it at a constant flow rate causes heat of reaction to be continuously produced in the same region inside the processing chamber 11, and the same portion of the processing chamber 11, the wafer boat 12 and the like is continuously heated. Hence, this portion eventually reaches a considerably high temperature and is damaged. In other words, in this embodiment, a large flame is intermittently produced by the reaction of hydrogen gas and fluorine gas. Hence, as compared with the case of continuously producing a small flame, local heating can be prevented. Thus, this embodiment can also prevent damage to the processing chamber 11, the wafer boat 12 and the like due to cleaning.

Furthermore, in this embodiment, nitrogen gas is supplied as a cooling and dilution gas into the processing chamber 11 in addition to hydrogen gas, which is a combustible gas, and fluorine gas, which is a combustion-supporting gas. Thus, the deposition film can be etched while the atmosphere in the processing chamber 11 is cooled. This also serves to prevent damage due to heat of reaction. Furthermore, local etching can be prevented also by diluting hydrogen gas and fluorine gas with nitrogen gas. Moreover, the mixing effect can be enhanced by mixing hydrogen gas and fluorine gas with nitrogen gas at a position far from the processing chamber 11.

Next, a fourth embodiment of the invention is described.

Figure 9:
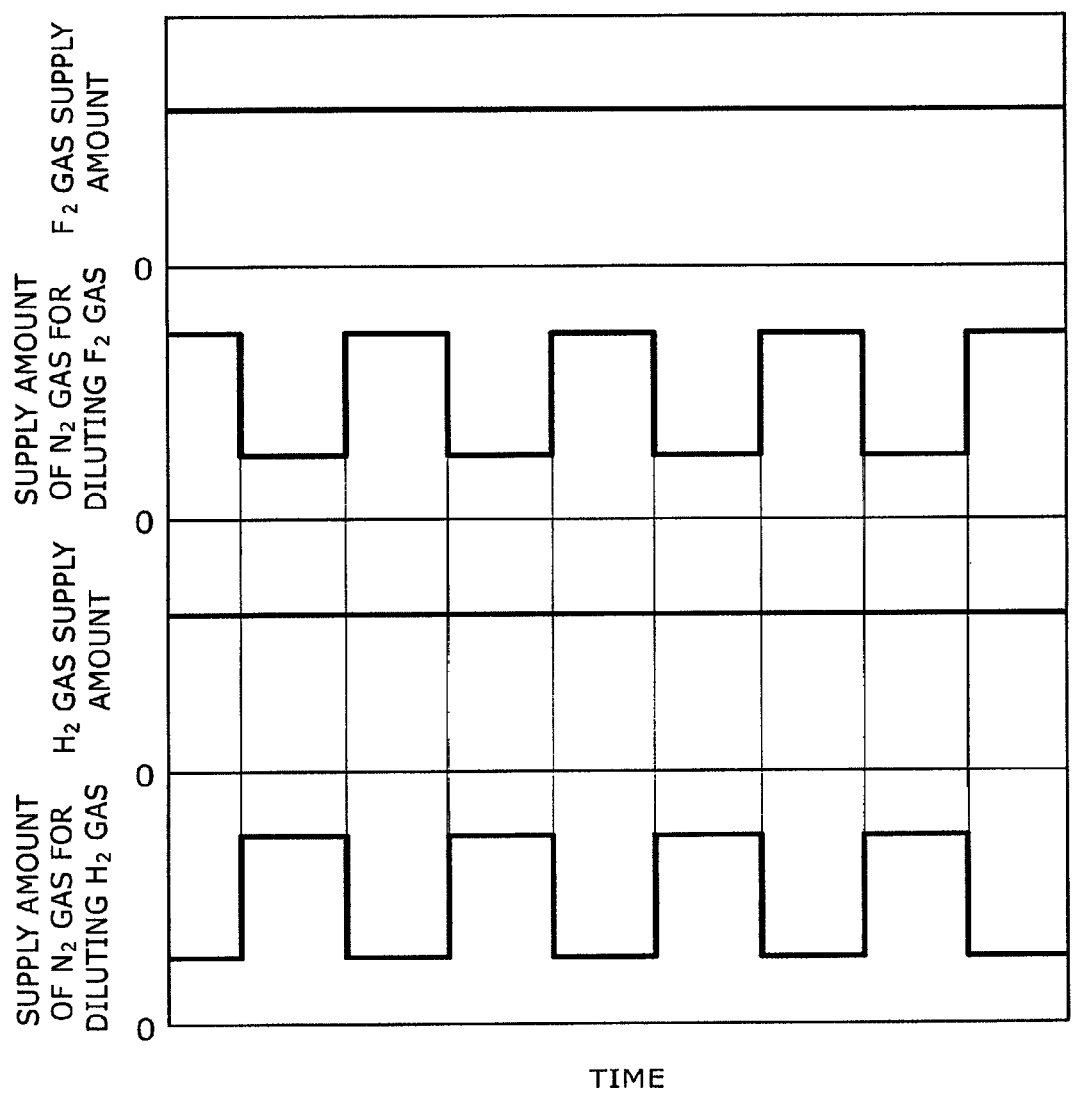
FIG. 9 is a graph illustrating change in the supply amount of each gas in a fourth embodiment of the invention, where the horizontal axis represents time, and the vertical axis represents gas supply amount.

FIG. 9 is a graph illustrating change in the supply amount of each gas in this embodiment, where the horizontal axis represents time, and the vertical axis represents gas supply amount.

The LPCVD apparatus used in this embodiment is the same as the LPCVD apparatus 3 (see FIG. 7) used in the above third embodiment.

In the following, a method for cleaning a semiconductor manufacturing apparatus according to this embodiment is described.

As shown in FIG. 7, also in this embodiment, like the above third embodiment, in the LPCVD apparatus 3, a $H_2/N_2$ gas is introduced into the processing chamber 11 through the hydrogen/nitrogen supply pipe 41, and a $F_2/N_2$ gas is introduced into the processing chamber 11 through the fluorine/nitrogen supply pipe 42.

Here, as shown in FIG. 9, while the supply amount of hydrogen gas and fluorine gas is kept constant, the supply amount (hereinafter referred to as "first supply amount") of nitrogen gas for diluting the hydrogen gas, that is, nitrogen gas supplied through the hydrogen/nitrogen supply pipe 41, and the supply amount (hereinafter referred to as "second supply amount") of nitrogen gas for diluting the fluorine gas, that is, nitrogen gas supplied through the fluorine/nitrogen supply pipe 42, are each changed temporally.

Specifically, while the total amount of the first supply amount and the second supply amount is kept constant, the first supply amount and the second supply amount are changed complementarily. That is, the step of relatively increasing the first supply amount and relatively decreasing the second supply amount, and the step of relatively decreasing the first supply amount and relatively increasing the second supply amount, are alternately performed.

According to this embodiment, the supply amount (first supply amount) of $N_2$ gas for diluting $H_2$ gas and the supply amount (second supply amount) of $N_2$ gas for diluting $F_2$ gas are changed complementarily. This temporally changes, in the processing chamber 11, the region of collision and reaction between hydrogen gas and fluorine gas, and hence temporally changes also the region where heat of reaction is produced. Consequently, the temperature distribution in the processing chamber 11 is uniformized, and no portion is continuously heated. Thus, local damage to the processing chamber 11 and the wafer boat 12 or other jig can be prevented. That is, in this embodiment, the position of the flame is temporally moved so that intensive heating of a particular portion can be prevented.

Furthermore, like the above third embodiment, this embodiment can also achieve the cooling effect by introducing nitrogen gas. Thus, this embodiment can also prevent damage to the processing chamber 11, the wafer boat 12 and the like due to cleaning.

Furthermore, according to this embodiment, the supply amount of hydrogen gas and fluorine gas is kept constant, and the total supply amount of nitrogen gas, that is, the total amount of the first supply amount and the second supply amount described above is also kept constant. Hence, the total amount of reaction can be kept constant. This allows stable etching.

Moreover, also in this embodiment, like the above third embodiment, hydrogen gas and fluorine gas, which are actual gases responsible for reaction, are diluted with nitrogen gas not responsible for reaction so that local etching in the processing chamber 11 can be prevented. Here, mixing of hydrogen gas and nitrogen gas and mixing of fluorine gas and nitrogen gas are performed preferably at a position far away from the processing chamber 11. This can further enhance the effect of mixing.

Next, a first variation of the fourth embodiment is described.

Figure 10:
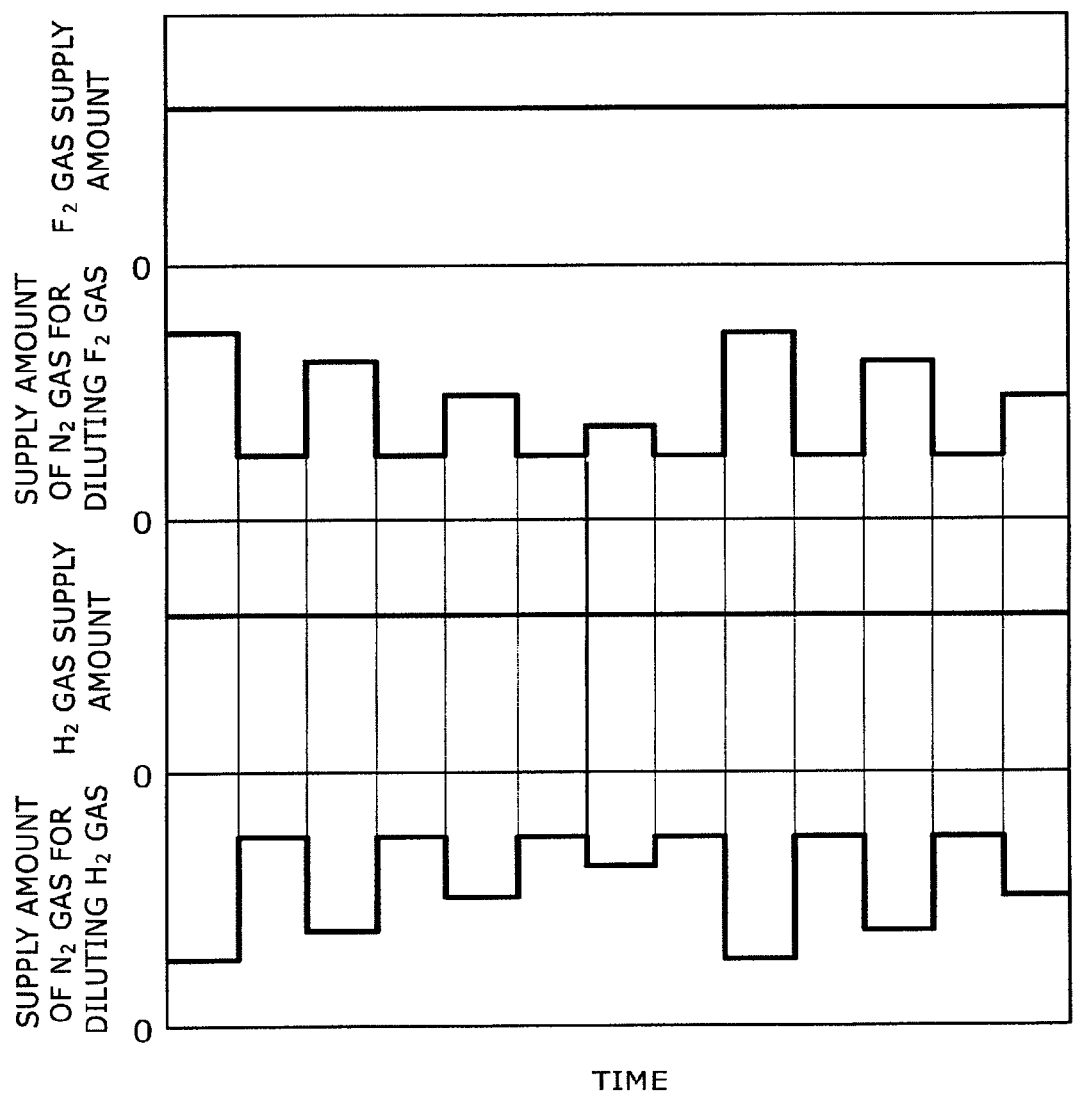
FIG. 10 is a graph illustrating change in the supply amount of each gas in a first variation of the fourth embodiment, where the horizontal axis represents time, and the vertical axis represents gas supply amount.

FIG. 10 is a graph illustrating change in the supply amount of each gas in this variation, where the horizontal axis represents time, and the vertical axis represents gas supply amount.

As shown in FIG. 10, this variation is the same as the above fourth embodiment in that the supply amount (first supply amount) of nitrogen gas for diluting hydrogen gas and the supply amount (second supply amount) of nitrogen gas for diluting fluorine gas are changed complementarily with the total amount kept constant. However, in this variation, the first and second supply amounts are each allowed to take on multiple values.

According to this variation, the position of reaction between hydrogen gas and fluorine gas can be changed among three or more positions in the processing chamber 11. Thus, the temperature in the processing chamber 11 can be uniformized more effectively. Consequently, local damage to the processing chamber 11 and the wafer boat 12 or other jig can be prevented more effectively. The cleaning method and its effect of this variation other than the foregoing are the same as those of the above fourth embodiment.

Next, a second variation of the fourth embodiment is described.

Figure 11:
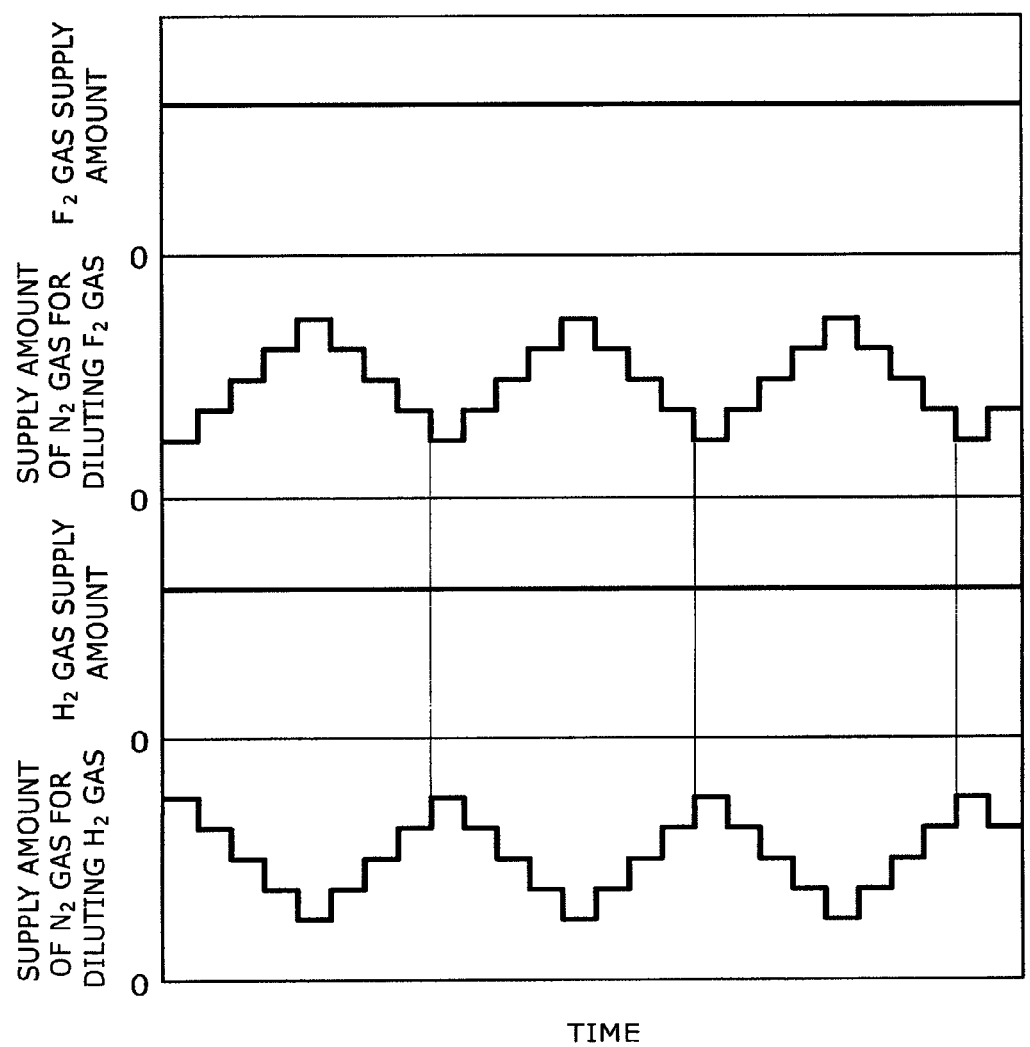
FIG. 11 is a graph illustrating change in the supply amount of each gas in a second variation of the fourth embodiment, where the horizontal axis represents time, and the vertical axis represents gas supply amount.

FIG. 11 is a graph illustrating change in the supply amount of each gas in this variation, where the horizontal axis represents time, and the vertical axis represents gas supply amount.

As shown in FIG. 11, this variation is also the same as the above fourth embodiment in that the first supply amount and the second supply amount are changed complementarily with the total amount thereof kept constant. However, in this variation, the first and second supply amounts are each changed gradually.

More specifically, from the state where the first supply amount is minimized and the second supply amount is maximized, the first supply amount is gradually increased, and the second supply amount is gradually decreased. Thus, the first supply amount is maximized, and the second supply amount is minimized. Subsequently, the first supply amount is gradually decreased, and the second supply amount is gradually increased. Thus, the first supply amount is minimized, and the second supply amount is maximized. This cycle is repeated.

In this variation, the position of reaction between hydrogen gas and fluorine gas can be gradually changed in the processing chamber 11. Thus, the temperature in the processing chamber 11 can be made more uniform, and local damage to the processing chamber 11 and the like can be prevented more effectively. The cleaning method and its effect of this variation other than the foregoing are the same as those of the above fourth embodiment.

In the above fourth embodiment and the first and second variation thereof, the total amount of the first supply amount and the second supply amount is illustratively kept constant. However, the invention is not limited thereto, but the total amount can be changed. Here, it is also possible to change only one of the first supply amount and the second supply amount. Furthermore, in the above fourth embodiment and the first and second variation thereof, the first and second supply amounts are illustratively changed stepwise. However, the first and second supply amount can also be changed continuously.

Next, a fifth embodiment of the invention is described.

Figure 12:
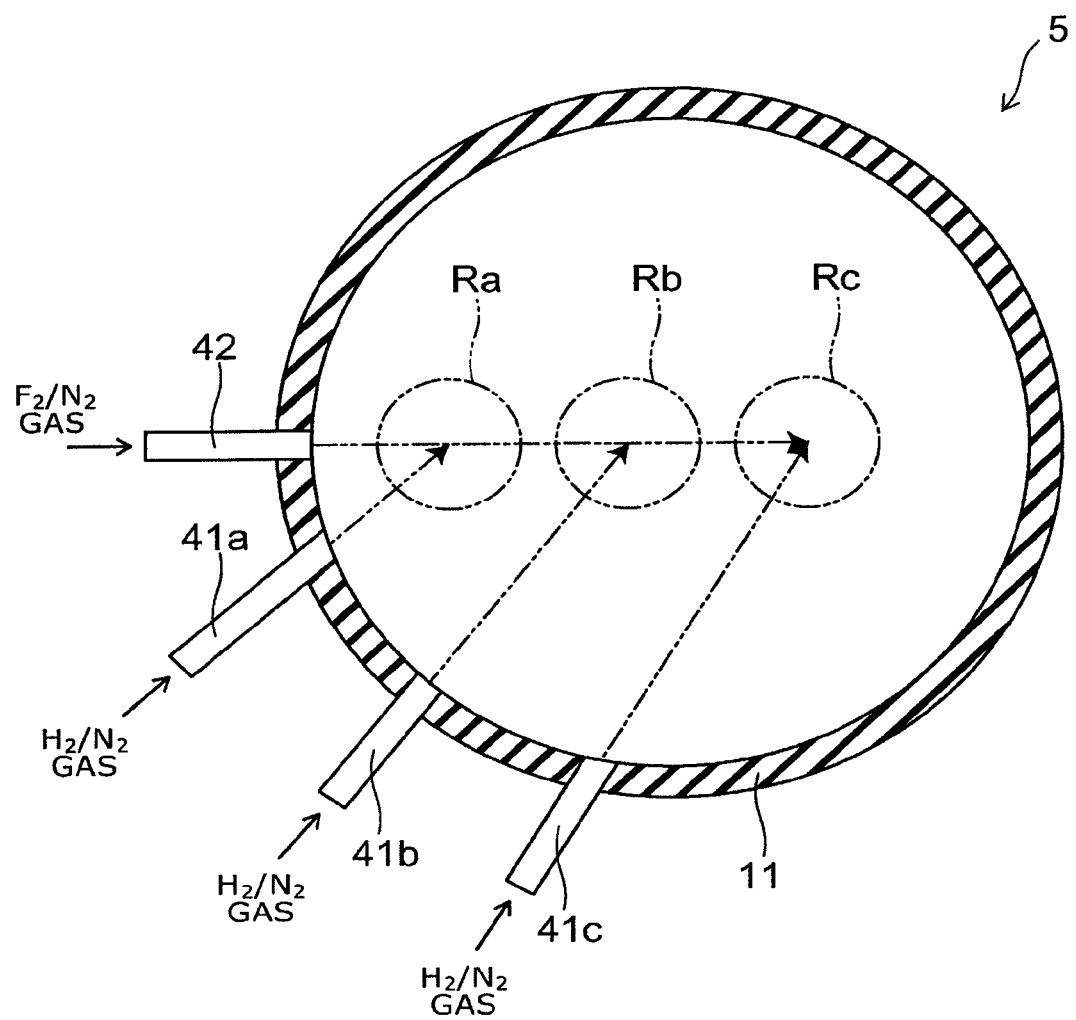
FIG. 12 is a plan view illustrating a semiconductor manufacturing apparatus according to a fifth embodiment of the invention.

FIG. 12 is a plan view illustrating a semiconductor manufacturing apparatus according to this embodiment.

Figure 13:
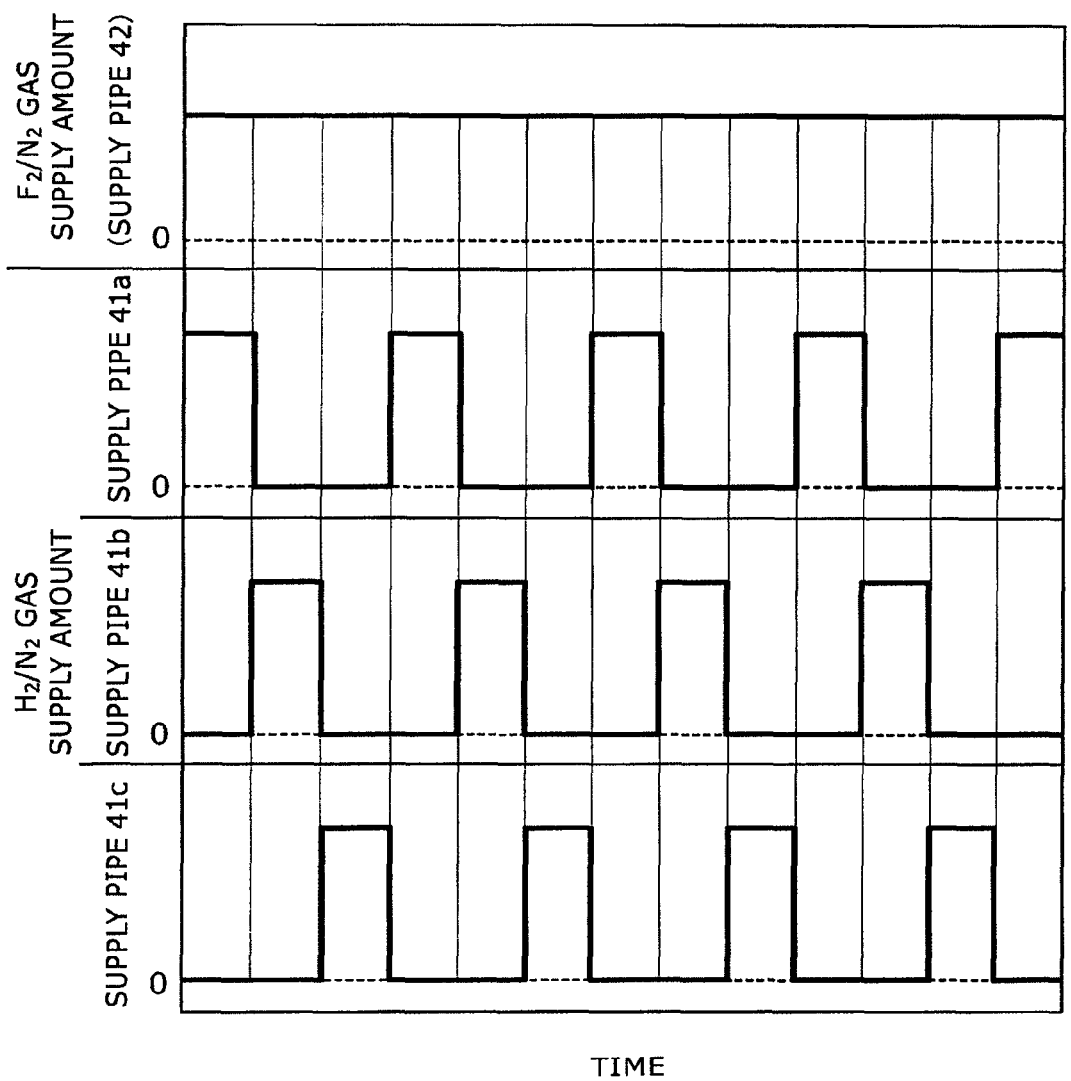
FIG. 13 is a graph illustrating a cleaning method according to the fifth embodiment, where the horizontal axis represents time, and the vertical axis represents gas supply amount.

FIG. 13 is a graph illustrating a cleaning method according to this embodiment, where the horizontal axis represents time, and the vertical axis represents gas supply a mount.

The semiconductor manufacturing apparatus according to this embodiment is also an LPCVD apparatus.

As shown in FIG. 12, in contrast to the LPCVD apparatus 3 (see FIG. 7) in the above third embodiment, the LPCVD apparatus 5 according to this embodiment includes a plurality of hydrogen/nitrogen supply pipes for introducing a mixed gas ($H_2/N_2$ gas) of hydrogen gas ($H_2$) and nitrogen gas ($N_2$) into the processing chamber 11, which are coupled to different positions of the processing chamber 11. For instance, the example shown in FIG. 12 includes three hydrogen/nitrogen supply pipes 41a, 41b, and 41c, which are arranged in this order from the fluorine/nitrogen supply pipe 42 side on the same horizontal plane. In FIG. 12, for convenience of illustration, the components other than the processing chamber 11, the hydrogen/nitrogen supply pipes 41a, 41b, and 41c, and the fluorine/nitrogen supply pipe 42 are not shown.

Next, a description is given of the operation of the LPCVD apparatus according to this embodiment configured as described above, that is, a method for cleaning a semiconductor manufacturing apparatus according to this embodiment.

As shown in FIGS. 12 and 13, in this embodiment, the supply pipe for passing the $H_2/N_2$ gas is temporally changed among the three hydrogen/nitrogen supply pipes 41a, 41b, and 41c. For instance, the $H_2/N_2$ gas is first supplied through the hydrogen/nitrogen supply pipe 41a into the processing chamber 11. Next, the $H_2/N_2$ gas is supplied through the hydrogen/nitrogen supply pipe 41b. Next, the $H_2/N_2$ gas is supplied through the hydrogen/nitrogen supply pipe 41c. Subsequently, this cycle is repeated. On the other hand, the $F_2/N_2$ gas is supplied into the processing chamber 11 through the same fluorine/nitrogen supply pipe 42.

Thus, by temporally switching the hydrogen/nitrogen supply pipe for passing the $H_2/N_2$ gas, the position where the $H_2/N_2$ gas and the $F_2/N_2$ gas collide and hydrogen gas and fluorine gas react is temporally changed in the processing chamber 11. For instance, in the example shown in FIG. 12, hydrogen gas and fluorine gas react primarily in region Ra when the hydrogen/nitrogen supply pipe 41a is in use, react primarily in region Rb when the hydrogen/nitrogen supply pipe 41b is in use, and react primarily in region Rc when the hydrogen/nitrogen supply pipe 41c is in use. Thus, the position of the flame, so to speak, is temporally moved, and hence the temperature distribution in the processing chamber 11 is uniformized. This avoids intensive heating of a particular portion in the processing chamber 11 and the wafer boat 12 or other jig, and local damage can be prevented. Thus, this embodiment can also prevent damage to the processing chamber 11, the wafer boat 12 and the like due to cleaning.

Furthermore, also in this embodiment, like the above third and fourth embodiment, hydrogen gas and fluorine gas are diluted with nitrogen gas so that local etching in the processing chamber 11 can be prevented. Here, mixing of gases is performed preferably at a position distanced from the processing chamber 11. This can further enhance the effect of mixing.

In this embodiment, only one fluorine/nitrogen supply pipe 42 and a plurality of hydrogen/nitrogen supply pipes are provided, for instance. However, the invention is not limited thereto. For instance, it is also possible to provide only one hydrogen/nitrogen supply pipe and a plurality of fluorine/nitrogen supply pipes. Alternatively, both the hydrogen/nitrogen supply pipe and the fluorine/nitrogen supply pipe can be provided in a plurality.

In this embodiment, the plurality of hydrogen/nitrogen supply pipes are illustratively used one by one. However, the invention is not limited thereto. A plurality of hydrogen/nitrogen supply pipes can be used in combination at an arbitrary timing. For instance, it is possible to use the hydrogen/nitrogen supply pipe 41a in a first period, the hydrogen/nitrogen supply pipe 41b in a second period, the hydrogen/nitrogen supply pipe 41c in a third period, the hydrogen/nitrogen supply pipes 41a and 41b in a fourth period, the hydrogen/nitrogen supply pipes 41b and 41c in a fifth period, the hydrogen/nitrogen supply pipes 41c and 41a in a sixth period, and the hydrogen/nitrogen supply pipes 41a, 41b, and 41c in a seventh period. Thus, the position of reaction in the processing chamber 11 can be changed in a more complex manner, and the temperature distribution in the processing chamber 11 can be uniformized more effectively.

Furthermore, in this embodiment, a mixed gas ($H_2/N_2$ gas) of hydrogen gas and nitrogen gas and a mixed gas ($F_2/N_2$ gas) of fluorine gas and nitrogen gas are illustratively supplied into the processing chamber 11. However, nitrogen gas can be replaced by other dilution gases which do not react with hydrogen gas and fluorine gas, or it is also possible to use no dilution gas.

The invention has been described with reference to the embodiments. However, the invention is not limited to these embodiments. For instance, the above embodiments can be practiced in combination with each other. For instance, also in the above first embodiment, nitrogen gas can be introduced as a cooling gas like the above second embodiment. Furthermore, those skilled in the art can suitably modify the above embodiments by addition, deletion, or design change of components, or by addition, omission, or condition change of processes, and such modifications are also encompassed within the scope of the invention as long as they fall within the spirit of the invention.

For instance, in the above embodiments, the semiconductor manufacturing apparatus is illustratively an LPCVD apparatus. However, the invention is not limited thereto, but applicable to any semiconductor manufacturing apparatus for manufacturing a semiconductor device in which a deposition film is formed in the course of its use. For instance, the invention is applicable to various film formation apparatuses, etching apparatuses, and other processing apparatuses. In this case, the processing chamber is an apparatus in which a silicon wafer or other workpiece is received and subjected to certain processes such as film formation and processing with the atmosphere therein being controlled.

The above embodiments illustratively use hydrogen gas ($H_2$) as a combustible gas and fluorine gas ($F_2$) as a combustion-supporting gas. However, the invention is not limited thereto. Any two or more gases generating a cleaning gas by an exothermic reaction can be used as a combustible gas and a combustion-supporting gas. Furthermore, in the above embodiments, the cooling mechanism is illustratively a water-cooling apparatus or a cooling gas, such as nitrogen gas ($N_2$). However, the invention is not limited thereto, but other cooling mechanism can also be used. For instance, the reaction chamber 13 in the first embodiment can be forced-air cooled.

The invention claimed is:

1. A method for cleaning a semiconductor manufacturing apparatus, comprising:
   supplying a combustible gas and a dilution gas into a processing chamber through a combustible gas supply pipe, and simultaneously supplying a combustion-supporting gas and a dilution gas into the processing chamber through a combustion-supporting gas supply pipe,
   at least one of a first supply amount of the dilution gas supplied through the combustible gas supply pipe and a second supply amount of the dilution gas supplied through the combustion-supporting gas supply pipe being temporally changed.

2. The method according to claim 1, wherein total amount of the first supply amount and the second supply amount is kept constant.

3. The method according to claim 1, wherein
   the supplying the combustible gas and the dilution gas and the simultaneously supplying the combustion-supporting gas and the dilution gas includes:
   a first supplying; and
   a second supplying,
   the first supply amount of the first supplying is more than the first supply amount of the second supplying,
   the second supply amount of the second supplying is more than the second supply amount of the first supplying, and
   the first supplying and the second supplying are alternately performed.

4. The method according to claim 1, wherein the first supply amount and the second supply amount have each multiple values.

5. The method according to claim 1, wherein the first supply amount and the second supply amount are each changed gradually.

6. The method according to claim 1, wherein hydrogen gas is used as the combustible gas, and fluorine gas is used as the combustion-supporting gas.

7. The method according to claim 1, wherein nitrogen gas is used as the dilution gas.

* * * * *